United States Patent
Kim et al.

(10) Patent No.: US 9,905,800 B2
(45) Date of Patent: Feb. 27, 2018

(54) ORGANIC LIGHT EMITTING DEVICE AND METHOD OF MANUFACTURING THE SAME

(71) Applicant: SAMSUNG DISPLAY CO., LTD., Yongin-si, Gyeonggi-do (KR)

(72) Inventors: Jaehyun Kim, Yongin-si (KR); Shogo Nishizaki, Yongin-si (KR); Cheho Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 129 days.

(21) Appl. No.: 14/853,736

(22) Filed: Sep. 14, 2015

(65) Prior Publication Data

US 2016/0260926 A1    Sep. 8, 2016

(30) Foreign Application Priority Data

Mar. 5, 2015   (KR) ........................ 10-2015-0031124

(51) Int. Cl.
*H01L 51/52*    (2006.01)

(52) U.S. Cl.
CPC .... *H01L 51/5253* (2013.01); *H01L 2251/558* (2013.01)

(58) Field of Classification Search
CPC .................................................. H01L 51/5253
See application file for complete search history.

(56) References Cited

U.S. PATENT DOCUMENTS

| | | | |
|---|---|---|---|
| 2012/0228668 A1 | 9/2012 | Thoumazet et al. | |
| 2012/0241811 A1* | 9/2012 | Kim | H01L 51/5253 257/100 |
| 2013/0059155 A1 | 3/2013 | Choi et al. | |
| 2013/0256673 A1* | 10/2013 | Nishiyama | H01L 29/78606 257/59 |
| 2014/0027739 A1* | 1/2014 | van de Weijer | H01L 51/5256 257/40 |
| 2014/0308580 A1 | 10/2014 | Yamada | |
| 2015/0008414 A1* | 1/2015 | Isobe | H01L 51/5228 257/40 |

FOREIGN PATENT DOCUMENTS

KR   10-2012-0109083 A   10/2012
KR   10-2014-0106567 A   9/2014

* cited by examiner

*Primary Examiner* — Lex Malsawma
*Assistant Examiner* — Xia Cross
(74) *Attorney, Agent, or Firm* — Lewis Roca Rothgerber Christie LLP

(57) ABSTRACT

An organic light-emitting display apparatus includes an organic light-emitting device including a first electrode, an intermediate layer including a light-emitting layer, and a second electrode; an organic barrier layer on the second electrode of the organic light-emitting device and having a first side facing the organic light-emitting device and a second side facing in an opposite direction from the first side; a buffer layer contacting the second side of the organic barrier layer; and a first inorganic barrier layer on the second side of the organic barrier layer with the buffer layer therebetween, wherein a water vapor transmission rate of the buffer layer is greater than $10^{-2}$ g/(cm²·day).

12 Claims, 6 Drawing Sheets

ORGANIC LIGHT EMITTING DEVICE AND METHOD OF MANUFACTURING THE SAME

CROSS-REFERENCE TO RELATED APPLICATION

This application claims priority to and the benefit of Korean Patent Application No. 10-2015-0031124, filed on Mar. 5, 2015, in the Korean Intellectual Property Office, the disclosure of which is incorporated herein in its entirety by reference.

BACKGROUND

1. Field

One or more exemplary embodiments relate to an organic light-emitting display apparatus and a method of manufacturing the organic light-emitting display apparatus.

2. Description of the Related Art

An organic light-emitting display device is a self-emitting display device that does not utilize a separate light source. Therefore, the organic light-emitting display device can be driven with a low voltage and be manufactured to be light and thin. Also, due to its wide viewing angle, high contrast, and fast response time, the organic light-emitting display device has been in the spotlight as a next-generation display device.

However, the organic light-emitting display device can be degraded by external moisture or oxygen. Thus, the organic light-emitting display device should be sealed in order to protect it from penetration of external moisture or oxygen. The properties of the organic light-emitting display device should not be affected by the forming of a sealing member.

SUMMARY

One or more exemplary embodiments include an organic light-emitting display apparatus and a method of manufacturing the same.

Additional aspects will be set forth in part in the description which follows and, in part, will be apparent from the description, or may be learned by practice of the presented embodiments.

According to one or more exemplary embodiments, an organic light-emitting display apparatus includes: an organic light-emitting device including a first electrode, an intermediate layer including a light-emitting layer, and a second electrode; an organic barrier layer on the second electrode of the organic light-emitting device and having a first side facing the organic light-emitting device and a second side opposite to the first side; a buffer layer contacting the second side of the organic barrier layer; and a first inorganic barrier layer on the second side of the organic barrier layer with the buffer layer therebetween, wherein a water vapor transmission rate of the buffer layer is greater than $10^{-2}$ g/(cm$^2$·day).

A water vapor transmission rate of the first inorganic barrier layer may be less than $10^{-4}$ g/(cm$^2$·day).

A thickness of the buffer layer may be less than a thickness of the first inorganic barrier layer.

A thickness of the buffer layer may be equal to or greater than 200 Å.

A thickness of the first inorganic barrier layer and a thickness of the buffer layer may satisfy the expression below:

$$T1 > 10 \times T2,$$

wherein T1 denotes the thickness of the first inorganic barrier layer and T2 denotes the thickness of the buffer layer.

The first inorganic barrier layer may contact a side of the buffer layer at a side farther from the organic barrier layer such that there is an interface between the first inorganic layer and the buffer layer, the buffer layer may have a first density and the first inorganic barrier layer may have a second density, and the first and second densities may vary in a thickness direction from the buffer layer to the first inorganic barrier layer, and the first and second densities may discontinuously vary with respect to the interface.

The first density may be uniform along a thickness direction of the buffer layer and the second density may be uniform along a thickness direction of the first inorganic barrier layer.

The buffer layer and the first inorganic barrier layer may both include a same element.

The apparatus may further include a second inorganic barrier layer between the organic light-emitting device and the organic barrier layer, and the second inorganic barrier layer may contact the first side of the organic barrier layer.

The second inorganic barrier layer may include a material different from a material of the first inorganic barrier layer.

According to one or more exemplary embodiments, a method of manufacturing an organic light-emitting display apparatus may include: forming an organic light-emitting device which includes a first electrode, an intermediate layer having a light-emitting layer, and a second electrode; forming an organic barrier layer having a first side facing the second electrode of the organic light-emitting device and a second side opposite to the first side; forming a buffer layer contacting the second side of the organic barrier layer; and forming a first inorganic barrier layer on the second side of the organic barrier layer with the buffer layer therebetween, wherein a water vapor transmission rate of the buffer layer is greater than $10^{-2}$ g/(cm$^2$·day).

A water vapor transmission rate of the first inorganic barrier layer may be less than $10^{-4}$ g/(cm$^2$·day).

At least one of a pressure and power, in a process of forming the buffer layer, may be different from a respective on of a pressure and power, in a process of forming the first inorganic barrier layer.

A thickness of the buffer layer may be less than a thickness of the first inorganic barrier layer.

A thickness of the buffer layer may be equal to or greater than 200 Å.

A thickness of the first inorganic barrier layer may be equal to or greater than 6,000 Å.

The first inorganic barrier layer may contact the buffer layer such that there is an interface between the first inorganic barrier layer and the buffer layer, the buffer layer may have a first density and the first inorganic barrier layer may have a second density, and the first and second densities may vary in a thickness direction from the buffer layer to the first inorganic barrier layer, and the first and second densities may discontinuously vary at the interface.

The buffer layer and the first inorganic barrier layer may each include a same element.

The method may further include forming a second inorganic barrier layer between the organic light-emitting device and the organic barrier layer, and the second inorganic barrier layer may contact the first side of the organic barrier layer.

The second inorganic barrier layer may include a material different from a material of the buffer layer and the first inorganic barrier layer.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Figure 1:
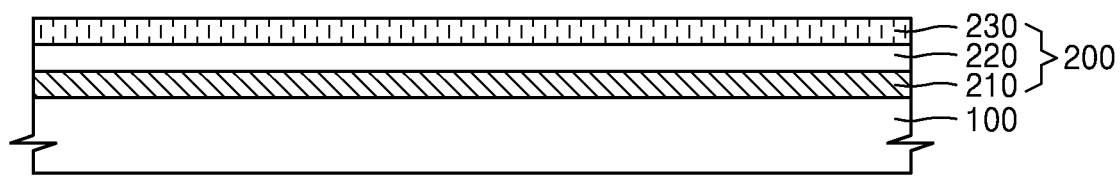
FIG. 1 is a schematic sectional view for illustrating a process of a method of manufacturing an organic light-emitting display apparatus according to an exemplary embodiment of the present invention.

As the invention allows for various changes and numerous embodiments, particular embodiments will be illustrated in the drawings and described in detail in the written description. Features and methods of the embodiments of the present invention will become clear from the detailed description of the embodiments together with the drawings. However, the present exemplary embodiments may have different forms and should not be construed as being limited to the descriptions set forth herein.

Reference will now be made in detail to exemplary embodiments, examples of which are illustrated in the accompanying drawings, wherein like reference numerals refer to like elements throughout and redundant explanations may be omitted.

As used herein, the term "and/or" includes any and all combinations of one or more of the associated listed items. Expressions such as "at least one of," when preceding a list of elements, modify the entire list of elements (or components) and do not modify the individual elements of the list. Further, the use of "may" when describing embodiments of the present invention refers to "one or more embodiments of the present invention." Also, the term "exemplary" is intended to refer to an example or illustration.

It will be understood that although the terms "first", "second", etc. may be used herein to describe various elements, components, regions, layers, and/or sections, these elements, components, regions, layers and/or sections should not be limited by these terms. These components are used to distinguish one element, component, region, layer or section from another element, component, region, layer or section. Thus, a first element, component, region, layer, or section discussed below could be termed a second element, component, region, layer, or section, without departing from the spirit and scope of the present invention.

The terminology used herein is for the purpose of describing particular embodiments and is not intended to be limiting of the present invention. As used herein, the singular forms "a" and "an" are intended to include the plural forms as well, unless the context clearly indicates otherwise.

It will be further understood that the terms "comprise," "comprises," "comprising," "includes," "including," and "include," when used herein specify the presence of stated features, integers, steps, operations, elements, and/or components, but do not preclude the presence or addition of one or more other features, integers, steps, operations, elements, components, and/or components.

It will be understood that when a layer, element, region, or component is referred to as being "on," "connected to," "coupled to," "connected with," "coupled with," or "adjacent to" another layer, element, region, or component, it can be "indirectly on," "indirectly connected to," "indirectly coupled to," "indirectly connected with," "indirectly coupled with," or "indirectly adjacent to" the other layer, element, region, or component. That is, for example, intervening layers, regions, or components may be present, or one or more intervening elements or layers may be present. Further "connection," "connected," etc. may also refer to "electrical connection," "electrically connect," etc. depending on the context in which they are used as those skilled in the art would appreciate. When an element or layer is referred to as being "directly on," "directly connected to," "directly coupled to," "directly connected with," "directly coupled with," or "immediately adjacent to" another element or layer, there are no intervening elements or layers present.

Further, it will also be understood that when one element, component, region, layer and/or section is referred to as being "between" two elements, components, regions, layers, and/or sections, it can be the only element, component, region, layer and/or section between the two elements, components, regions, layers, and/or sections, or one or more intervening elements, components, regions, layers, and/or sections may also be present.

As used herein, the term "substantially," "about," and similar terms are used as terms of approximation and not as terms of degree, and are intended to account for the inherent deviations in measured or calculated values that would be recognized by those of ordinary skill in the art.

As used herein, the terms "use," "using," and "used" may be considered synonymous with the terms "utilize," "utilizing," and "utilized," respectively.

Sizes of elements (or components) in the drawings may be exaggerated for convenience of explanation. In other words, since sizes and thicknesses of components in the drawings are arbitrarily illustrated for convenience of explanation, the following embodiments are not limited thereto.

Embodiments may be implemented differently from an order described herein (e.g., a specific process order may be performed differently from the described order). For further example, two consecutively described processes may be performed substantially at the same time or performed in an order opposite to the described order.

FIG. 1 and FIGS. 3 through 9 are schematic sectional views for illustrating processes of a method of manufacturing an organic light-emitting display apparatus according to an exemplary embodiment of the present invention. FIG. 2 is a detailed sectional view of the organic light-emitting display apparatus of FIG. 1.

Figure 2:
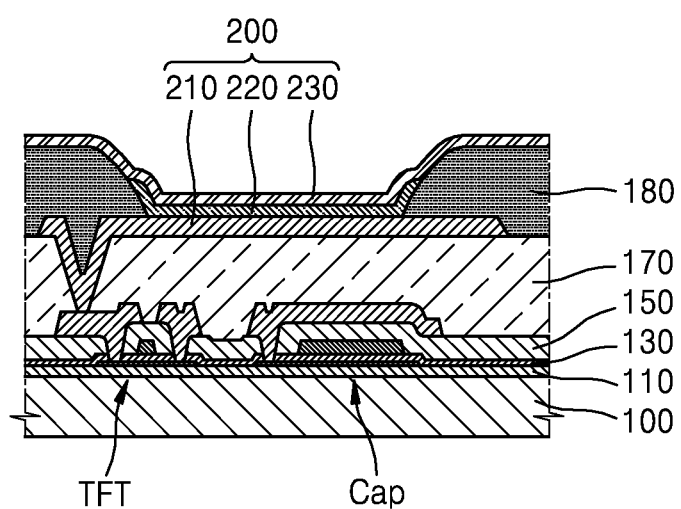
FIG. 2 is a detailed sectional view of the organic light-emitting display apparatus of FIG. 1.

Referring to FIG. 1, organic light-emitting device 200 is formed on a substrate 100.

The substrate 100 may be rigid or flexible. The substrate 100 may include one or more of various suitable materials such as glass, metal, or plastic, including polyethylene (PET), polyethylene naphthalate (PEN) and polyimide.

Referring to FIG. 2, a thin film transistor TFT, a storage capacitor Cap and a variety of layers may be formed in advance before forming an organic light-emitting device 200.

A barrier layer 110 which prevents or substantially prevents foreign materials from penetrating into a semiconductor layer of the TFT, a gate insulating film 130 which insulates a gate electrode from the semiconductor layer of the TFT, an intermediate insulating film 150 which insulates the source and drain electrodes of the TFT from a gate electrode, and a planarization film 170, which covers the TFT and has a generally (or substantially) flat top surface, may be provided on the substrate 100.

The organic light-emitting device 200 may include a first electrode 210, an intermediate layer 220 which is formed on the first electrode 210, and a second electrode 230 which is formed on the intermediate layer 220. In an embodiment, the first electrode 210 may be an anode and the second electrode 230 may be a cathode. However, the present inventive concept is not limited to this and according to the driving method of an organic light-emitting display apparatus, the first electrode 210 may be a cathode and the second electrode 230 may be an anode. Holes and electrons from the first and second electrodes 210 and 230, respectively, are injected in a light-emitting layer in the intermediate layer 220. Thus, light is emitted as an excitons, which are formed by a combination of holes and electrons, decay to a ground state from an excited state.

The first electrode 210 may be electrically connected to any one of the source and drain electrodes of the TFT. The first electrode 210 may be a semi-transparent (or transparent) electrode or a reflection electrode. When the first electrode 210 is a semi-transparent (or transparent) electrode, the first electrode 210 may include, for example, indium tin oxide (ITO), indium zinc oxide (IZO), zinc oxide (ZnO), indium oxide ($In_2O_3$), indium gallium oxide (IGO), and/or aluminum zinc oxide (AZO). When the first electrode 210 is a reflection electrode, the first electrode 210 may be a reflection film including Ag, Mg, Al, Pt, Pd, Au, Ni, Nd, Ir, Cr, and/or compounds thereof. In another embodiment, the first electrode 210 may include a reflection film including Ag, Mg, Al, Pt, Pd, Au, Ni, Nd, Ir, Cr, and/or compounds thereof, and a film comprising ITO, IZO, ZnO, and/or $In_2O_3$ may be formed on the reflection film.

A pixel defining film 180 exposes the top side of the first electrode 210 through an opening, and the intermediate layer 220 including the light-emitting layer may be placed on the top side of the first electrode 210.

The light-emitting layer may include a low molecular weight organic material and/or a high molecular weight polymer organic material capable of emitting one or more of red, green, blue, and white lights. The intermediate layer 220 may include at least one of a hole injection layer (HIL), a hole transport layer (HTL), an electron transport layer (ETL) and an electron injection layer (EIL).

The second electrode 230 may be a reflection electrode or a semi-transparent (or transparent) electrode. When the second electrode 230 is a semi-transparent (or transparent) electrode, the second electrode 230 may be a semi-transmission metal layer including Ag and Mg. In another embodiment, the second electrode 230 may include a layer comprising Li, Ca, LiF/Ca, LiF/Al, Al, Mg or compounds, and another layer which is placed on the layer and is formed with a semi-transparent (or transparent) material such as ITO, IZO, ZnO or $In_2O_3$ When the second electrode 230 is a reflection electrode, the second electrode 230 may include a layer including at least one of, for example, Li, Ca, LiF/Ca, LiF/Al, Al, Ag, and Mg.

Figure 3:
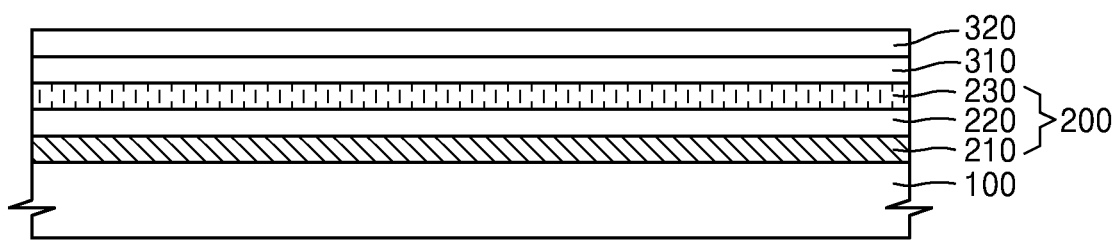
FIG. 3 is a schematic sectional view for illustrating a process of a method of manufacturing an organic light-emitting display apparatus according to an exemplary embodiment of the present invention.

Referring to FIG. 3, a capping layer 310 and a protection layer 320 may be formed on the light-emitting device 200.

The capping layer 310 may be formed on the second electrode 230 of the light-emitting device 200 and protect the second electrode 230. Also, the capping layer 310 may reduce a resistance of the second electrode 230. The capping layer 310 may include a compound including an organic material, an inorganic material or phosphorus.

The protection layer 320 may be formed on the capping layer 310 and when a process for forming a thin film encapsulation film 400 (e.g., including 410, 420, 430, and/or 440) is performed, may perform a role of protecting the light-emitting device 200. The protection layer 320 may include LiF. In another embodiment, the protection layer 320 may include one or more of CsF, NaF and $Li_2O$, etc.

Figure 4:
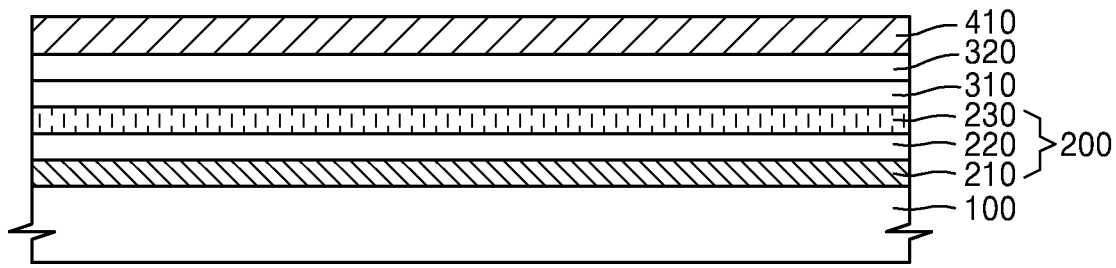
FIG. 4 is a schematic sectional view for illustrating a process of a method of manufacturing an organic light-emitting display apparatus according to an exemplary embodiment of the present invention.

Referring to FIG. 4, an inorganic barrier layer 410 may be formed on the organic light-emitting device 200. The inorganic barrier layer 410 may prevent or reduce infiltration of moisture or oxygen from outside The inorganic barrier layer 410 may be formed by a chemical vapor deposition (CVD), for example, a plasma enhanced chemical vapor deposition (PECVD). The inorganic barrier layer 410 may include siliconoxynitride (SiON). In another embodiment, the inorganic barrier layer 410 may include silicon oxide (SiOx).

Figure 5:
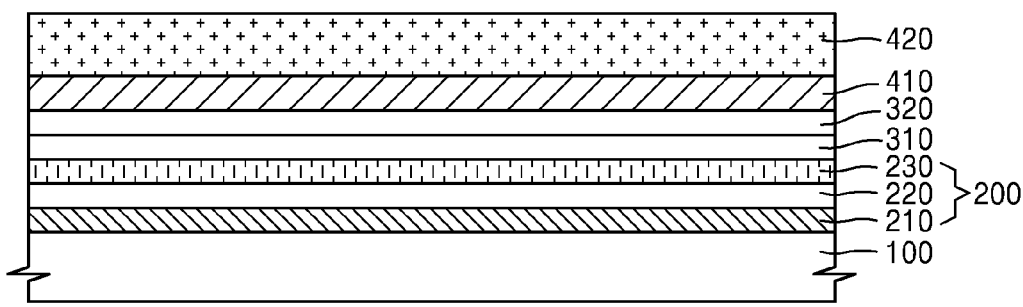
FIG. 5 is a schematic sectional view for illustrating a process of a method of manufacturing an organic light-emitting display apparatus according to an exemplary embodiment of the present invention.

Referring to FIG. 5, an organic barrier layer 420 is formed. The organic barrier layer 420 is disposed directly over the inorganic barrier layer 410 and may contact (e.g., directly contact) the inorganic barrier layer 410. The organic barrier layer 420 may alleviate the internal stress of the inorganic barrier layer 410 and an inorganic barrier layer 440 to be explained later. The organic barrier layer 420 may fill a minute crack in the inorganic barrier layer 310.

The organic barrier layer 420 may include a polymer material. In an embodiment, the organic barrier layer 420 may be formed by vapor-depositing a monomer in a liquid (or gas) state and hardening the vapor-deposited monomer material with heat or light such as an ultraviolet ray.

Figure 6:
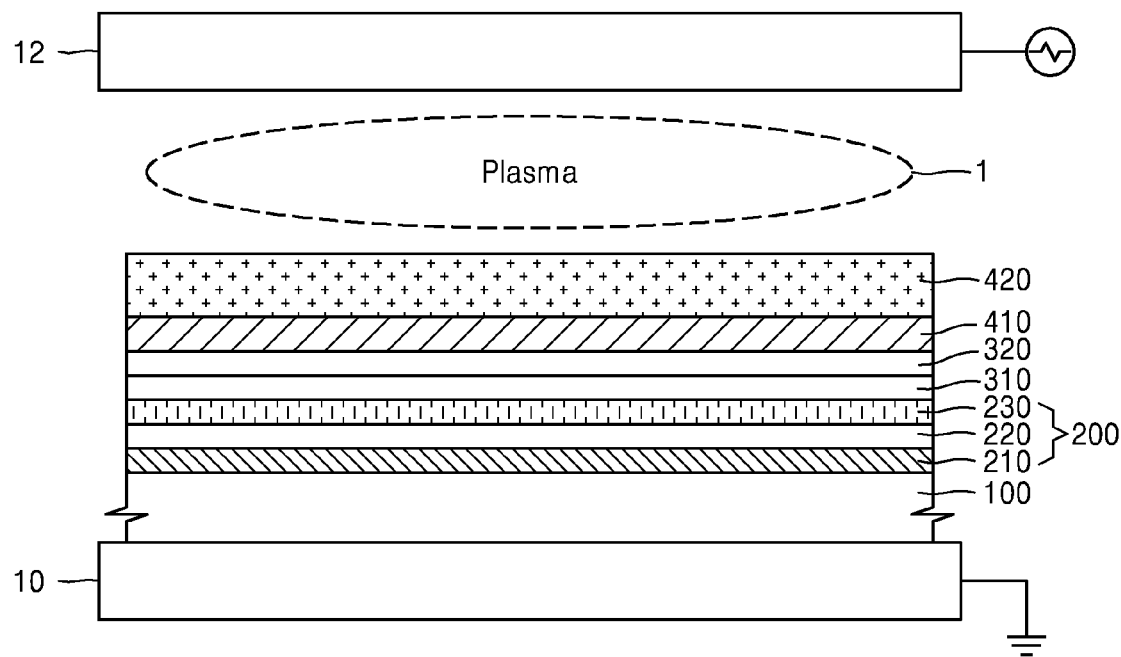
FIG. 6 is a schematic sectional view for illustrating a process of a method of manufacturing an organic light-emitting display apparatus according to an exemplary embodiment of the present invention.
Figure 7:
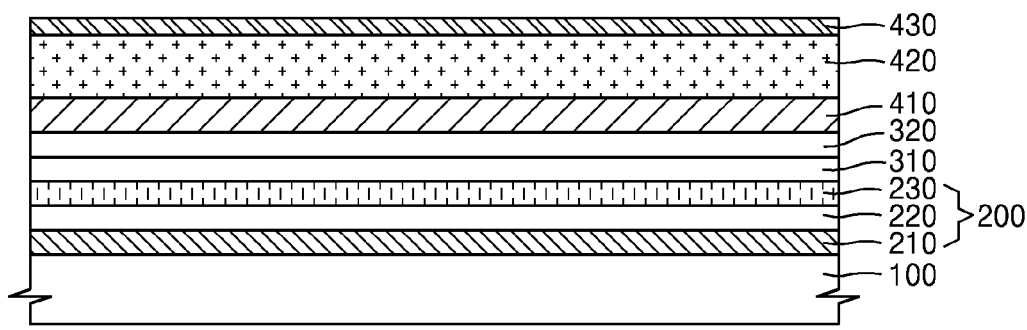
FIG. 7 is a schematic sectional view for illustrating a process of a method of manufacturing an organic light-emitting display apparatus according to an exemplary embodiment of the present invention.

Referring to FIGS. 6 and 7, a buffer layer 430 may be formed on the organic barrier layer 420. The buffer layer 430 may be formed by a PECVD. The buffer layer 430 may be formed in a chamber including at least two electrodes 10 and 12. The buffer layer 430 may be formed by using a first plasma 1 formed by applying an AC voltage to one or both of the electrodes 10 and 12. In FIG. 6, an AC voltage is shown as being applied to the electrode 12, while ground is being applied to electrode 10. The AC voltage may include, for example, a radio frequency (RF).

Figure 8:
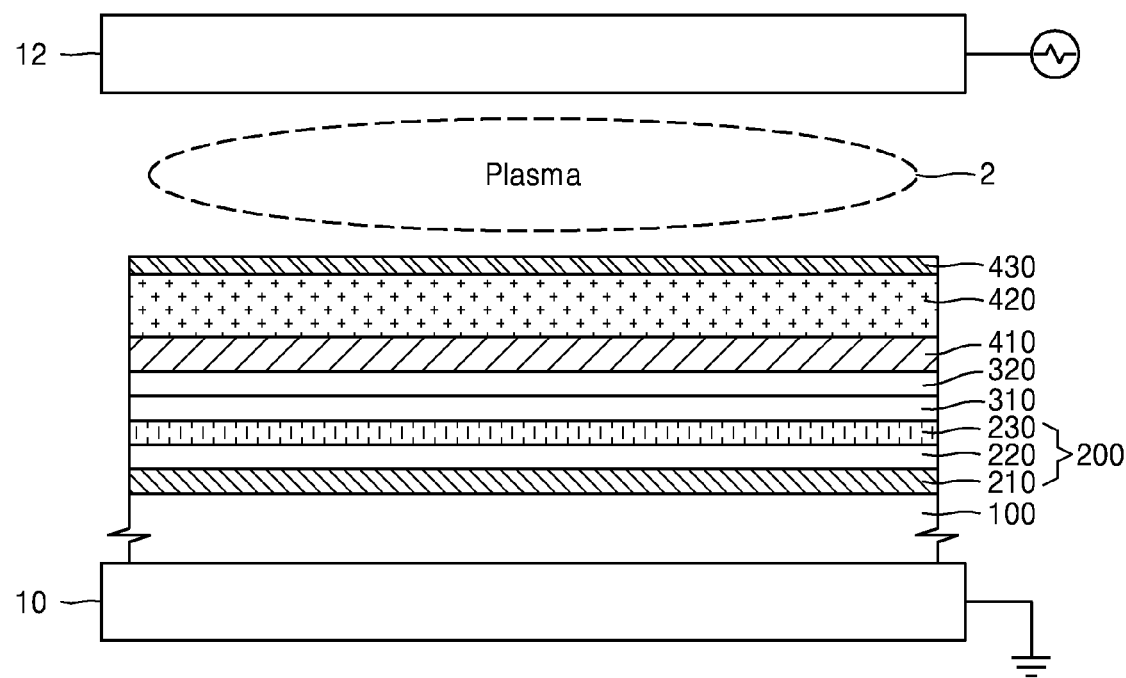
FIG. 8 is a schematic sectional view for illustrating a process of a method of manufacturing an organic light-emitting display apparatus according to an exemplary embodiment of the present invention.
Figure 9:
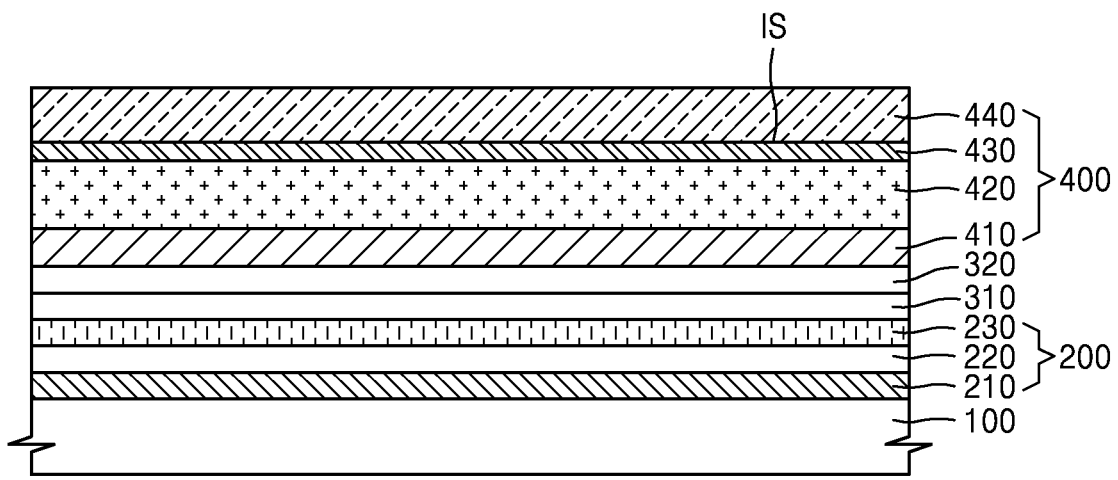
FIG. 9 is a schematic sectional view for illustrating a process of a method of manufacturing an organic light-emitting display apparatus according to an exemplary embodiment of the present invention.

Referring to FIGS. 8 and 9, the inorganic barrier layer 440 is formed on the buffer layer 430. The inorganic barrier layer 440 is formed to prevent or reduce infiltration of moisture or oxygen from the outside. The inorganic barrier layer 440 (hereinafter, the inorganic barrier layer 440 will be referred to as a first inorganic barrier layer) formed on top of the organic barrier layer 420 may include a material different from that included in the inorganic barrier layer 410 (hereinafter, the inorganic barrier layer 410 will be referred to as a second inorganic barrier layer) at the bottom of the organic barrier layer 420. For example, the first inorganic barrier layer 440 may include silicon nitride (SiNx).

The inorganic barrier layer 440 may be formed by a PECVD. The inorganic barrier layer 440 may be formed in a chamber including at least two electrodes 10 and 12. The inorganic barrier layer 440 may be formed by using a second plasma 2 formed by applying an AC voltage to one or both of the electrodes 10 and 12. In FIG. 8, an AC voltage is shown as being applied to the electrode 12, while ground is being applied to electrode 10. The AC voltage may include, for example, a radio frequency (RF).

The conditions of a process for forming the buffer layer 430 are different from those of a process for forming the inorganic barrier layer 440. For example, a first pressure for forming the buffer layer 430 may be greater than a second pressure for forming the inorganic barrier layer 440, and/or a first power applied to the electrode 12 for forming the buffer layer 430 may be less than a second power applied to the electrode 12 for forming the inorganic barrier layer 440.

The first and second inorganic barrier layers 440 and 410 of the thin film encapsulation film 400 formed by the process explained above with reference to FIGS. 4 through 9 may prevent or reduce infiltration of oxygen or moisture, and the organic barrier layer 420 interposed therebetween may alleviate the internal stress of the thin film encapsulation film.

When the first and second inorganic barrier layers 440 and 410 include different materials, the first and second inorganic barrier layers 440 and 410 may have molecular structures and/or crystal structures different from each other, and by using different molecular structures or crystal structures, infiltration of moisture and oxygen may be effectively prevented or reduced.

The buffer layer 430 is interposed between the organic barrier layer 420 and the first inorganic barrier layer 440 and contacts (e.g., directly contacts) the top side of the organic barrier layer 420. As explained above with reference to FIGS. 6 and 7, the buffer layer 430 may be formed in a higher pressure and/or a lower power condition than the first inorganic barrier layer 440 and may have a higher water vapor transmission rate.

The water vapor transmission rate of the buffer layer 430 may be greater than $10^{-2}$ g/(cm$^2$·day). The buffer layer 430 with a water vapor transmission rate of $10^{-2}$ g/(cm$^2$·day) may not prevent transmission of moisture or oxygen. However, since the buffer layer 430 contacts (e.g., directly contacts) the top side of the organic barrier layer 420 and covers the organic barrier layer 420, it may prevent or reduce the organic barrier layer 420 from being damaged in a process for forming the first inorganic barrier layer 440. The buffer layer 430 is a protection layer of the organic barrier layer 420 during the process for forming the first inorganic barrier layer 440.

The buffer layer 430 will now be explained in detail with reference to FIG. 10.

Figure 10:
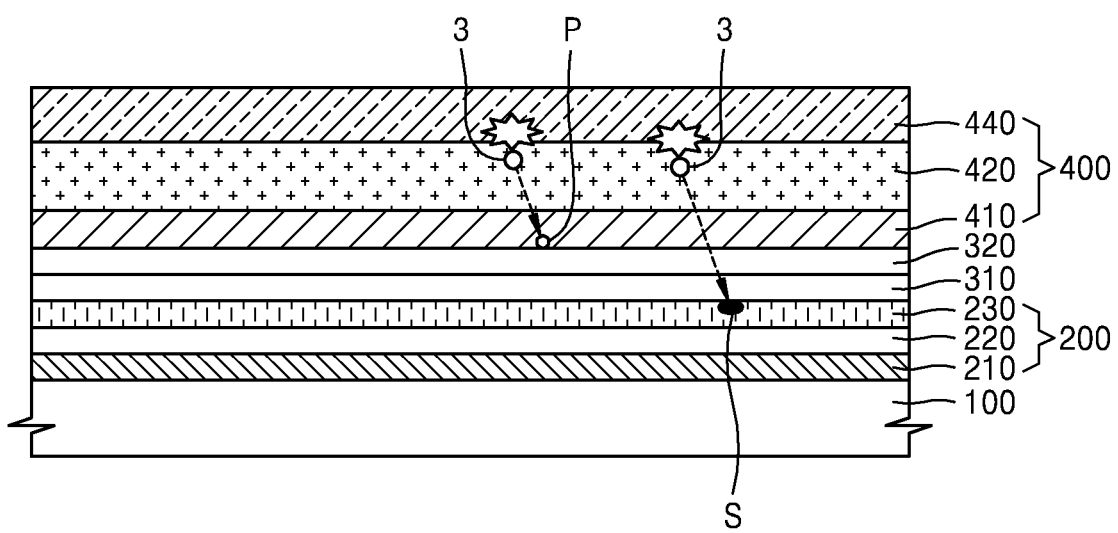
FIG. 10 is a schematic sectional view of an organic light-emitting display apparatus according to an exemplary embodiment of the present invention for comparison.

FIG. 10 is a schematic sectional view of an organic light-emitting display apparatus according to an exemplary embodiment of the present invention for comparison. The organic light-emitting display apparatus shown in FIG. 10 does not include a buffer layer 430. The layers 410, 420 and 440, which form a thin film encapsulation film of the organic light-emitting display apparatus according to the comparison embodiment, are formed by a process identical to that explained above.

Referring to FIG. 10, according to the comparison embodiment, a first inorganic barrier layer 440 is formed directly over an organic barrier layer 420 and in a process for forming the first inorganic barrier layer 440, an AC power source having a high frequency such as a radio frequency is used.

When a high frequency plasma is generated using a high frequency AC power source, a negative voltage (dc bias voltage) may be generated by the traveling speed differences between ions and electrons existing inside a chamber, and thus the collision speed of ions may increase. Some of these ions may cut the bonding between atoms forming the organic barrier layer 420. When some of the atoms whose bonding is cut, for example, oxygen atoms 3, may move toward the organic light-emitting device 200, the atoms 3 may be combined with particles P (examples: foreign materials inflowing in a process for forming a capping layer, a protection layer, and/or a second inorganic barrier layer) and oxidize a second electrode 230 such that a dark spot is formed.

However, according to an embodiment, the buffer layer 430 is placed over the organic barrier layer 420 and therefore it may prevent or substantially prevent the organic barrier layer 420 from being damaged by a second plasma 2 formed in the process for forming the first inorganic barrier layer 440. As the buffer layer 430 is formed under conditions different from those for forming the first inorganic barrier layer 440, for example, under conditions of a high pressure and/or a lower power, the absolute value of the negative voltage (dc bias voltage) is low. Thus, it may prevent or reduce cutting of bonding between atoms forming the organic barrier layer 420 by ions.

The thickness of the buffer layer 430 may be formed less than that of the first inorganic barrier layer 440. The thickness of the buffer layer 430 may be equal to or greater than about 200 Å. If the thickness of the buffer layer 430 is less than 200 Å, it is difficult to prevent damage in the organic barrier layer 420. In a non-limiting embodiment, the thickness of the buffer layer 430 may be about 500 Å.

As described above, it is difficult for the buffer layer 430 formed using the first plasma 1 to shut off moisture or oxygen. However, according to the present embodiment, as the first inorganic barrier layer 440 whose water vapor transmission rate is less than $10^{-2}$ g/(cm$^2$·day) is formed on the buffer layer 430, the function of preventing moisture penetration of the thin film encapsulation film 400 may be performed fully. As a non-limiting embodiment, the first inorganic barrier layer 440 may have a water vapor transmission rate of $1.8 \times 10^{-5}$ g/(cm$^2$·day).

The thickness of the first inorganic barrier layer 440 is greater than that of the buffer layer 430. In an embodiment, the thickness (T1) of the first inorganic barrier layer and the thickness (T2) of the buffer layer satisfies expressions below:

$$T1 > 10 \times T2.$$

In an embodiment, the thickness of the first inorganic barrier layer 440 may be equal or substantially equal to or greater than about 6000 Å. A layer other than the first inorganic barrier layer 440 may not be required to be formed on the buffer layer 430 and therefore the number of layers of the thin film encapsulation film 400 may be reduced. In another embodiment, layered structures of an organic barrier layer which is formed with organic materials, a buffer layer and an inorganic barrier layer may be further provided on the first inorganic barrier layer 440.

The buffer layer 430 may include inorganic materials. In an embodiment, the buffer layer 430 may include an element identical to that of the first inorganic barrier layer 440. For example, when the buffer layer 430 and the first inorganic barrier layer 440 include silicon and nitrogen, the buffer layer 430 and the first inorganic barrier layer 440 may be formed in an identical chamber.

As the buffer layer 430 and the first inorganic barrier layer 440 are formed under different environments, they may have different densities.

Figure 11:
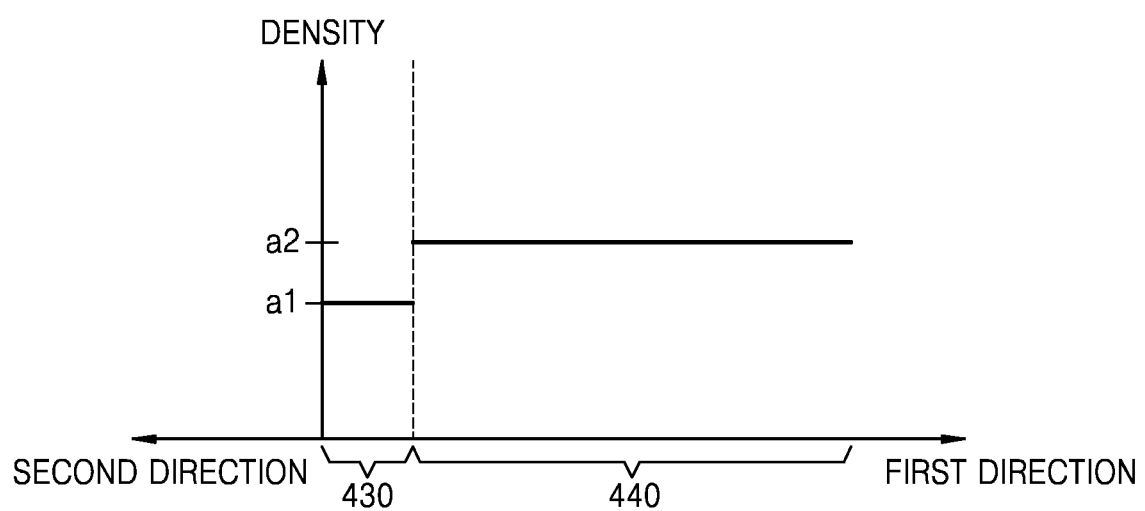
FIG. 11 is a graph showing densities of a buffer layer and a first inorganic barrier layer of an organic light-emitting display apparatus according to an exemplary embodiment of the present invention.

FIG. 11 is a graph showing densities of a buffer layer 430 and a first inorganic barrier layer 440 of an organic light-emitting display apparatus according to an exemplary embodiment of the present invention. The horizontal axis of FIG. 11 indicates the thickness direction of the organic light-emitting display apparatus and the vertical axis indicates the density. In the horizontal axis of FIG. 11, a first direction indicates a direction from a substrate 100 to an encapsulation film 400 and a second direction indicates a direction from the encapsulation film 400 to the substrate 100.

As shown in FIG. 11, the density of the buffer layer 430 may be less than that of the first inorganic barrier layer 440, and the density a1 of the buffer layer 430 and the density a2 of the first inorganic barrier layer 440 may rapidly/discontinuously change with respect to the interface IS of FIG. 9 formed as the buffer layer 430 and the first inorganic barrier layer 440 contact each other. The density of the first inorganic barrier layer 440 placed along a first direction around the interface IS may have a uniform value along the thickness direction, and the density of the buffer layer 430 placed along a second direction around the interface IS may also have a uniform value along the thickness direction. Having a uniform value means the deviation (or variation) of the density is equal or less than about 4%.

It should be understood that exemplary embodiments described herein should be considered in a descriptive sense and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims and their equivalents.

What is claimed is:

1. An organic light-emitting display apparatus, comprising:
an organic light-emitting device comprising a first electrode, an intermediate layer comprising a light-emitting layer, and a second electrode;
an organic barrier layer on the second electrode of the organic light-emitting device and having a first side facing the organic light-emitting device and a second side opposite to the first side;
a buffer layer contacting the second side of the organic barrier layer, the buffer layer comprising an inorganic material; and
a first inorganic barrier layer on the second side of the organic barrier layer with the buffer layer therebetween,
wherein a water vapor transmission rate of the buffer layer is greater than $10^{-2}$ g/(cm$^2$·day),
wherein the first inorganic barrier layer contacts a side of the buffer layer at a side farther from the organic barrier layer such that there is an interface between the first inorganic barrier layer and the buffer layer,
wherein the buffer layer has a first density and the first inorganic barrier layer has a second density,
wherein the first and second densities vary in a thickness direction from the buffer layer to the first inorganic barrier layer, and the first and second densities discontinuously vary at the interface,
wherein the first density is uniform along a thickness direction of the buffer layer and the second density is uniform along a thickness direction of the first inorganic barrier layer, and
wherein a thickness of the first inorganic barrier layer and a thickness of the buffer layer satisfy the expression below:

$$T1 > 10 \times T2,$$

wherein T1 denotes the thickness of the first inorganic barrier layer and T2 denotes the thickness of the buffer layer.

2. The apparatus of claim 1, wherein a thickness of the buffer layer is equal to or greater than 200 Å.

3. The apparatus of claim 1, wherein the buffer layer and the first inorganic barrier layer each comprise a same element.

4. The apparatus of claim 1, further comprising:
a second inorganic barrier layer between the organic light-emitting device and the organic barrier layer,
wherein the second inorganic barrier layer contacts the first side of the organic barrier layer.

5. The apparatus of claim 4, wherein the second inorganic barrier layer comprises a material different from a material of the first inorganic barrier layer.

6. A method of manufacturing an organic light-emitting display apparatus, the method comprising:
forming an organic light-emitting device comprising a first electrode, an intermediate layer having a light-emitting layer, and a second electrode;
forming an organic barrier layer having a first side facing the second electrode of the organic light-emitting device and a second side opposite to the first side;
forming a buffer layer contacting the second side of the organic barrier layer, the buffer layer comprising an inorganic material; and
forming a first inorganic barrier layer on the second side of the organic barrier layer with the buffer layer therebetween,
wherein a water vapor transmission rate of the buffer layer is greater than $10^{-2}$ g/(cm$^2$·day),
wherein the first inorganic barrier layer contacts a side of the buffer layer at a side farther from the organic barrier layer such that there is an interface between the first inorganic barrier layer and the buffer layer,
wherein the buffer layer has a first density and the first inorganic barrier layer has a second density, wherein the first and second densities vary in a thickness direction from the buffer layer to the first inorganic barrier layer, and the first and second densities discontinuously vary at the interface, wherein the first density is uniform along a thickness direction of the buffer layer and the second density is uniform along a thickness direction of the first inorganic barrier layer, and wherein a thickness of the first inorganic barrier layer and a thickness of the buffer layer satisfy the expression below:

$$T1 > 10 \times T2,$$

wherein T1 denotes the thickness of the first inorganic barrier layer and T2 denotes the thickness of the buffer layer.

7. The method of claim 6,
wherein at least one of a pressure and power, in a process of forming the buffer layer, is different from a respective one of a pressure and power, in a process of forming the first inorganic barrier layer.

8. The method of claim 6,
wherein a thickness of the buffer layer is equal to or greater than 200 Å.

9. The method of claim 6,
wherein a thickness of the first inorganic barrier layer is equal to or greater than 6,000 Å.

10. The method of claim 6,
wherein the buffer layer and the first inorganic barrier layer each comprise a same element.

11. The method of claim 6, further comprising:
forming a second inorganic barrier layer between the organic light-emitting device and the organic barrier layer, and
wherein the second inorganic barrier layer contacts the first side of the organic barrier layer.

12. The method of claim 11,
wherein the second inorganic barrier layer comprises a material different from a material of the buffer layer and the first inorganic barrier layer.

\* \* \* \* \*